(12) United States Patent
Wu et al.

(10) Patent No.: US 9,142,640 B1
(45) Date of Patent: Sep. 22, 2015

(54) CONTAINMENT STRUCTURE FOR EPITAXIAL GROWTH IN NON-PLANAR SEMICONDUCTOR STRUCTURE

(71) Applicant: GLOBALFOUNDRIES Inc., Grand Cayman, KY (US)

(72) Inventors: Xusheng Wu, Ballston Lake, NY (US); Xiaodong Yang, Hopewell Junction, NY (US); Yanxiang Liu, Glenville, NY (US); Jin Ping Liu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/306,864

(22) Filed: Jun. 17, 2014

(51) Int. Cl.
*H01L 29/66* (2006.01)
*H01L 29/78* (2006.01)

(52) U.S. Cl.
CPC ...... *H01L 29/66545* (2013.01); *H01L 29/6681* (2013.01); *H01L 29/66484* (2013.01); *H01L 29/785* (2013.01)

(58) Field of Classification Search
CPC . H01L 29/78; H01L 29/785; H01L 29/66795; H01L 21/02458; H01L 21/336; H01L 21/823807

USPC ......... 257/366, 288, 369; 438/172, 210, 199, 438/283, 478
See application file for complete search history.

(56) References Cited

U.S. PATENT DOCUMENTS

| | | | |
|---|---|---|---|
| 2013/0277752 A1* | 10/2013 | Glass et al. | 257/369 |
| 2015/0041908 A1* | 2/2015 | Adam et al. | 257/369 |

* cited by examiner

*Primary Examiner* — Selim Ahmed
*Assistant Examiner* — Changhyun Yi
(74) *Attorney, Agent, or Firm* — Wayne F. Reinke, Esq.; Heslin Rothenberg Farley & Mesiti P.C.

(57) ABSTRACT

A non-planar transistor is fabricated with dummy or sacrificial epitaxy and a structure for subsequent replacement or final epitaxy containment is created around the sacrificial epitaxy. The dummy epitaxy is then removed and replaced with the replacement epitaxy. The containment structure allows for uniform growth of the replacement epitaxy and prevents merger. Where n-type and p-type structures are present, the replacement epitaxy process is performed for each type, while protecting the other type with a mask. Optionally, one of the replacement epitaxies, i.e., the one for n-type or p-type, may be used as the dummy epitaxy, resulting in the need for only one mask.

10 Claims, 8 Drawing Sheets

US 9,142,640 B1

CONTAINMENT STRUCTURE FOR EPITAXIAL GROWTH IN NON-PLANAR SEMICONDUCTOR STRUCTURE

BACKGROUND OF THE INVENTION

1. Technical Field

The present invention generally relates to epitaxial growth for non-planar semiconductor structures. More particularly, the present invention relates to the use of dummy epitaxy to create a containment structure for replacement epitaxy in non-planar semiconductor structures.

2. Background Information

As semiconductor device size has shrunk in recent years, new fabrication techniques have developed to address issues resulting from the reduced size. For example, the use of non-planar transistors instead of planar transistors has allowed device size to continue to get smaller. Along with non-planar transistors, replacement gates and source/drain epitaxial structures have further extended the size reduction. However, it has proved difficult to obtain uniformity of the epitaxial structures, due to damage from chemicals used when the gates are replaced. Further, the non-uniformity leads to merger of neighboring epitaxial structures, which can affect performance or even cause device failure.

Thus, a need exists for more uniformity of epitaxial structures in non-planar semiconductor structures.

SUMMARY OF THE INVENTION

The shortcomings of the prior art are overcome and additional advantages are provided through the provision, in one aspect, of a method of creating uniform epitaxial structures in non-planar semiconductor structures. The method includes providing a starting non-planar semiconductor structure, the structure including a semiconductor substrate, at least one raised semiconductor structure coupled to the substrate, at least one gate surrounding a portion of the at least one raised structure, a gate cap and spacers around each gate, and a layer of isolation material on the substrate on opposite sides of the at least one raised structure. The method further includes growing dummy epitaxy on one or more active regions of the at least one raised structure, creating an epitaxy containment layer of a desired height over the isolation layer, the epitaxy containment layer separating adjacent dummy epitaxy, and replacing the dummy epitaxy with replacement epitaxy for one or more of the at least one raised structure. The replacement epitaxy is contained by the epitaxy containment layer, and the replacing includes removing the dummy epitaxy to expose the at least one raised structure, and growing the replacement epitaxy on the exposed at least one raised structure.

In accordance with another aspect, a non-planar semiconductor structure is provided. The structure includes a semiconductor substrate, at least one raised semiconductor structure coupled to the substrate, at least one gate structure surrounding a portion of one or more of the at least one raised structure, each gate having a gate cap and spacers, and dummy epitaxial structures on one or more active regions of the at least one raised structure. The dummy epitaxial structures are approximately uniform in size. The structure further includes a layer of isolation material on opposite sides of each of the at least one raised structure, and an epitaxy containment layer of a desired height on the isolation layer.

These, and other objects, features and advantages of this invention will become apparent from the following detailed description of the various aspects of the invention taken in conjunction with the accompanying drawings.

DETAILED DESCRIPTION OF THE INVENTION

Figure 1:
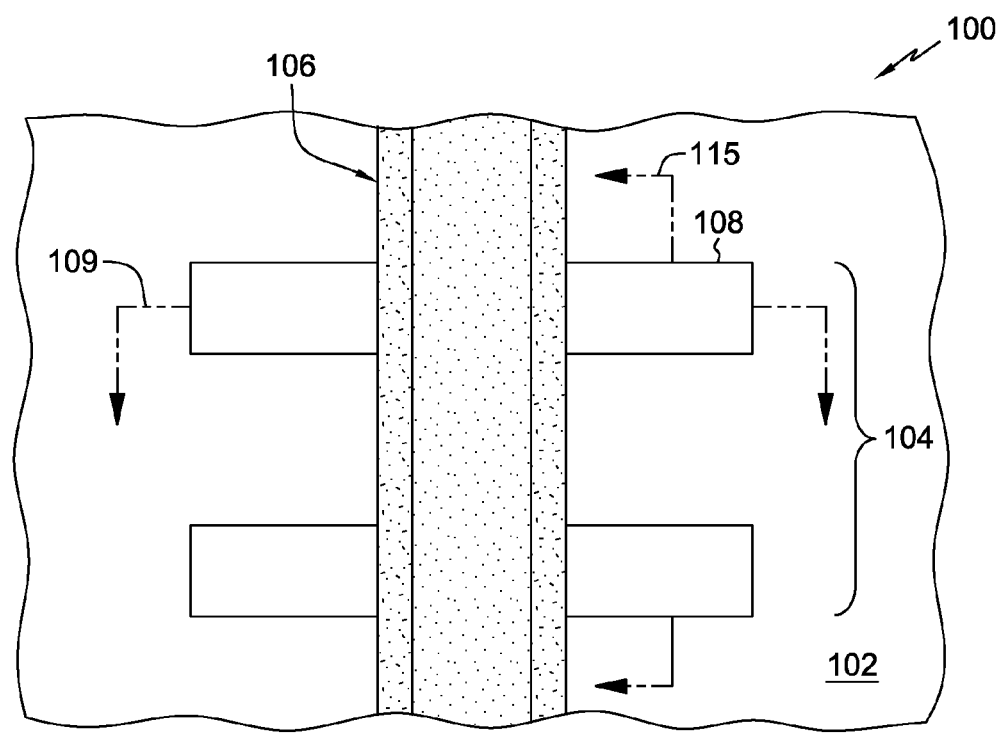
FIG. 1 is a top-down view of one example of a starting non-planar semiconductor structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a top-down view of one example of a starting non-planar semiconductor structure 100, in accordance with one or more aspects of the present invention. In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The non-planar structure further includes at least one raised semiconductor structure 104 (raised with respect to the substrate). In one example, the raised structures may take the form of a "fin." The raised structure(s) may be etched from a bulk substrate, and may include, for example, any of the materials listed above with respect to the substrate. Further, some or all of the raised structure(s) may include added impurities (e.g., by doping), making them N type or P type. The structure further includes at least one gate structure 106 surrounding a portion of one or more of the raised structures.

Figure 2:
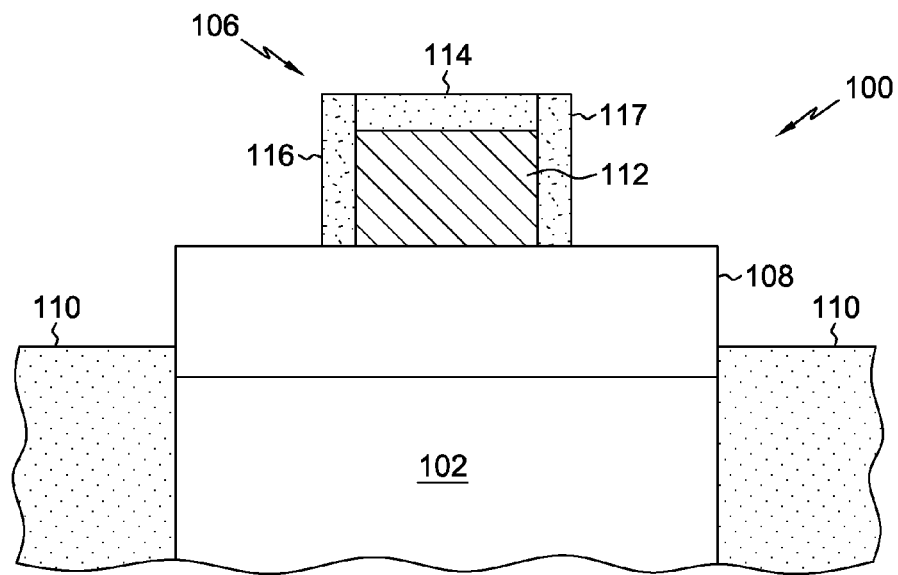
FIG. 2 is a cross-sectional view of the starting structure of FIG. 1, taken along one of the raised semiconductor structures, in accordance with one or more aspects of the present invention.
Figure 3:
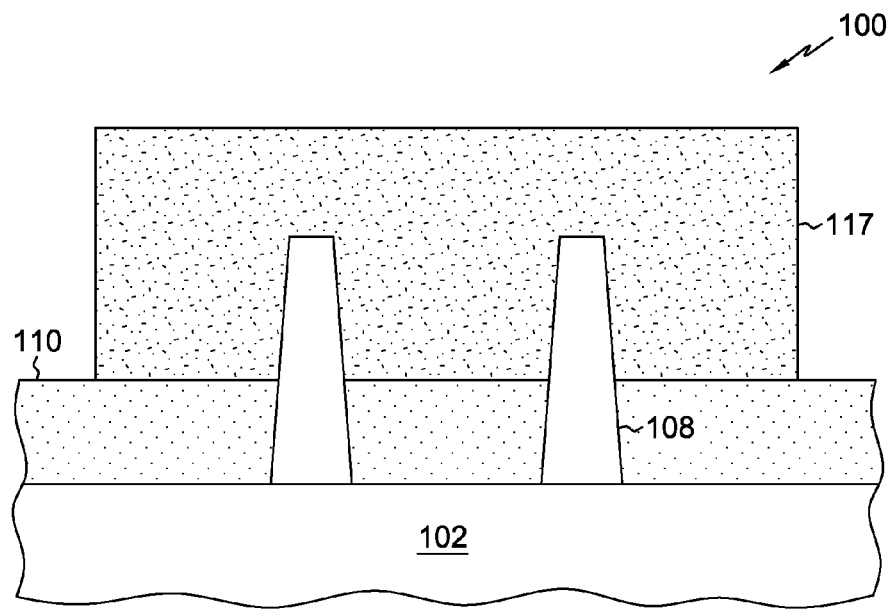
FIG. 3 is a cross-sectional view of the starting structure of FIG. 1, taken across the raised semiconductor structures, in accordance with one or more aspects of the present invention.

FIGS. 2 and 3 are cross-sectional views of the starting structure 100 of FIG. 1, taken at line 109 in FIG. 1, i.e., along raised semiconductor structure 108 (FIG. 2), and at line 115 in FIG. 1, i.e., across raised structures 104 (FIG. 3), in accordance with one or more aspects of the present invention. On opposite sides of each raised structure is an isolation material, for example, a shallow trench isolation material may be used with bulk silicon substrates, or, in the case of using silicon-on-insulator, the material may be Buried Oxide (BOX) material. In both cases, the isolation materials may include, for example, one or more oxides. As shown in FIG. 2, portions of the raised structure(s), e.g., channel region(s) of a FinFET, are encompassed by dummy gate structures, for example, gate structure 106. In the present example, the gate is a dummy gate 112 (e.g., polysilicon) and is surrounded by a gate cap 114 and spacers 116 and 117. The cap and spacers may be, for example, a nitride, a low-k nitride, a hybrid material (e.g., nitride/oxide/nitride), or a low-k hybrid material. As used herein, the term "low-k" refers to a dielectric constant value of less than 3.9.

Figure 4:
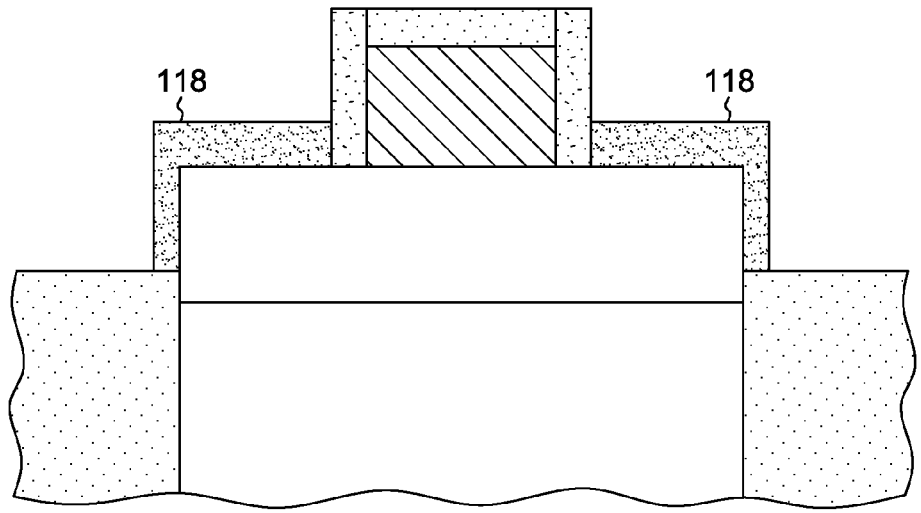
FIGS. 4 and 5 are cross-sectional views of the structures of FIGS. 2 and 3, respectively, after growing dummy epitaxy on the raised structures, in accordance with one or more aspects of the present invention.
Figure 5:
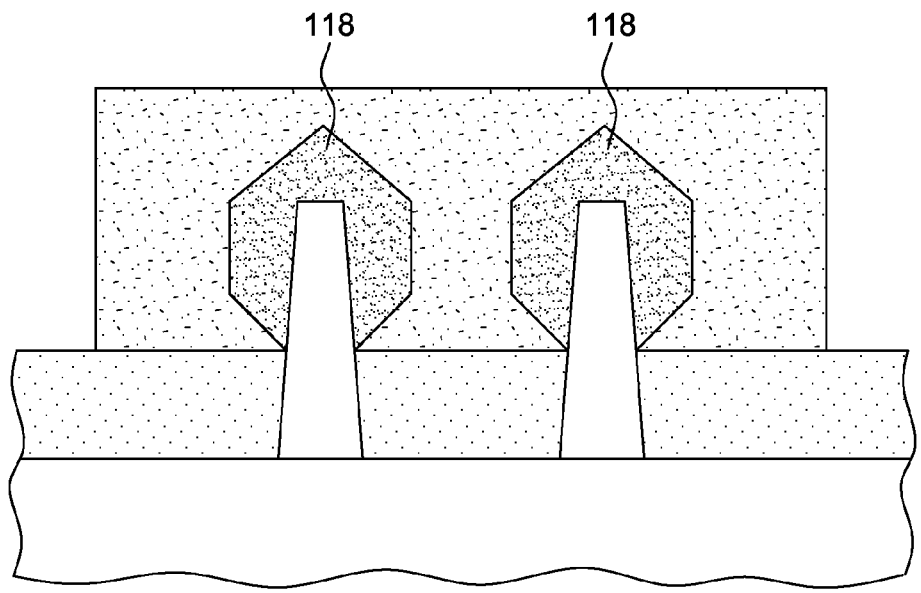

FIGS. 4 and 5 are cross-sectional views of the structures of FIGS. 2 and 3, respectively, after growing dummy epitaxy 118 on the raised structures, in accordance with one or more aspects of the present invention. In one example, where the substrate is silicon, the dummy epitaxy may be, for example, epitaxial silicon. Growing the dummy epitaxy may be accomplished using techniques such as, for example, vapor-phase epitaxy, molecular-beam epitaxy or liquid-phase epitaxy.

Figure 6:
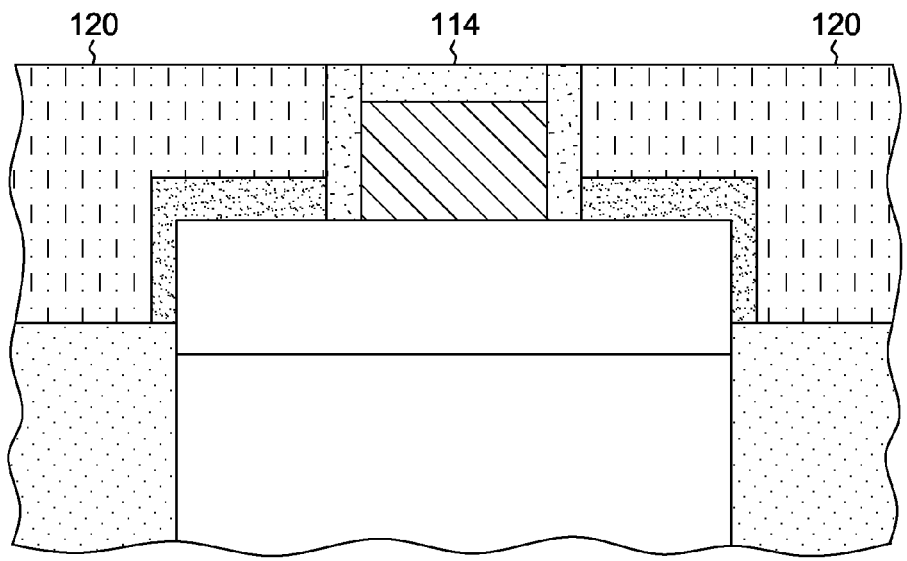
FIGS. 6 and 7 are cross-sectional views of the structures of FIGS. 4 and 5, respectively, after blanket deposition of an oxide and etching down to the gate cap, in accordance with one or more aspects of the present invention.
Figure 7:
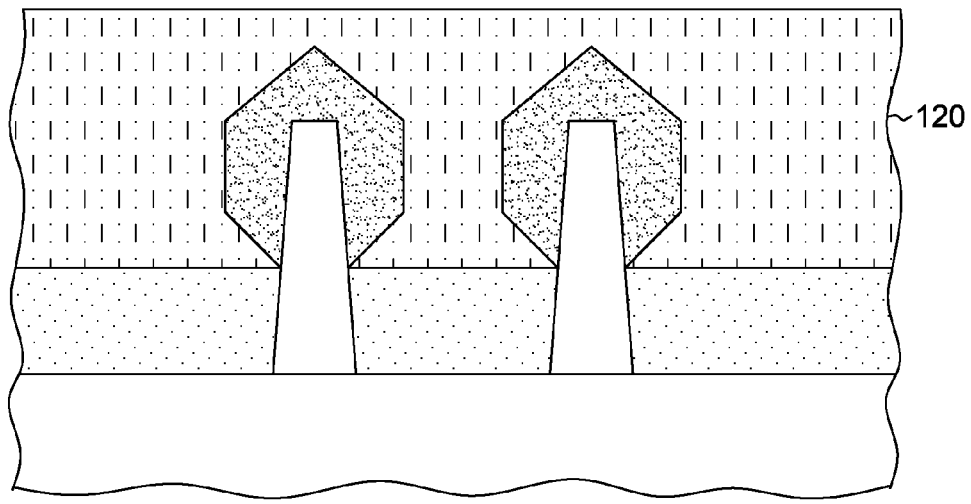

FIGS. 6 and 7 are cross-sectional views of the structures of FIGS. 4 and 5, respectively, after blanket deposition of a layer 120 of a filler material and etching the same down to the gate cap 114, in accordance with one or more aspects of the present invention. The filler material may be, for example, an oxide (e.g., silicon oxide), and may be a same material as isolation layer 110. In one example, the etching may be accomplished by chemical mechanical polishing, using the gate cap (e.g., silicon nitride) as a stop.

Figure 8:
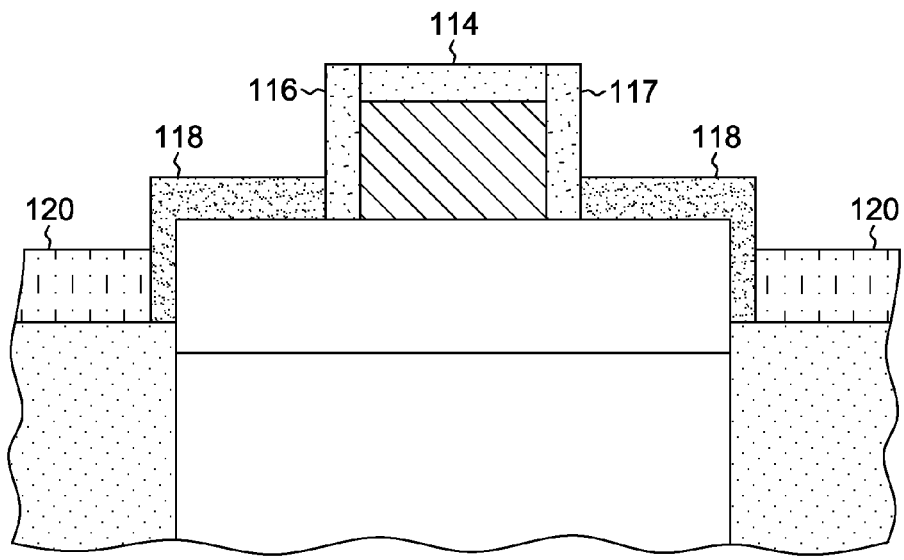
FIGS. 8 and 9 are cross-sectional views of the structures of FIGS. 6 and 7, respectively, after selective etching of the oxide to a desired height for containment of subsequent replacement epitaxy, in accordance with one or more aspects of the present invention.
Figure 9:
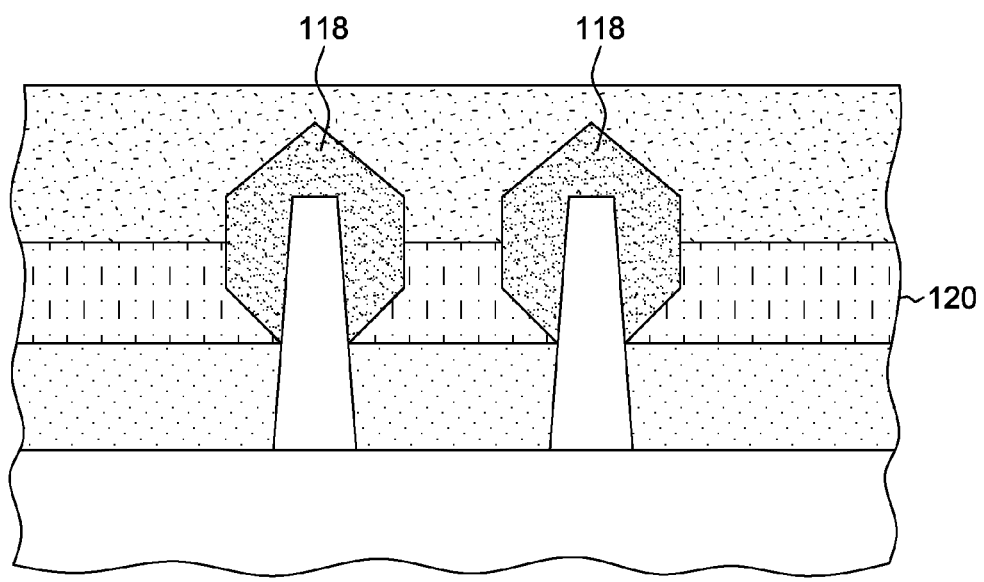

FIGS. 8 and 9 are cross-sectional views of the structures of FIGS. 6 and 7, respectively, after selective etching of the filler layer 120 to a desired height for containment of subsequent replacement epitaxy, in accordance with one or more aspects of the present invention. The etching is "selective" to the material of the filler layer (e.g., an oxide), and not the materials of the gate cap 114, spacers 116, 117 and dummy epitaxy 118. In one example, where the filler material is an oxide, the selective etch may be accomplished using a dry etch, e.g., RIE (Reactive-ion etching).

Figure 10:
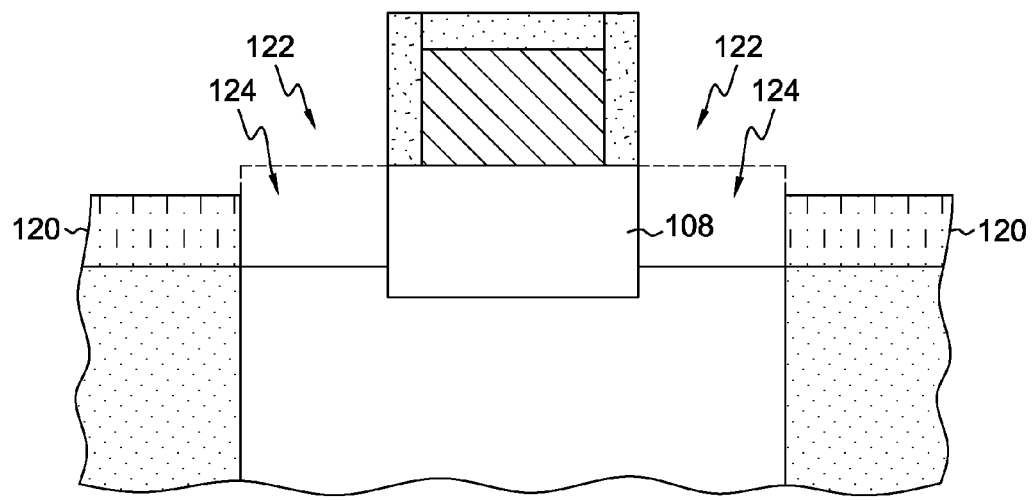
FIGS. 10 and 11 are cross-sectional views of the structures of FIGS. 8 and 9, respectively, after removal of the dummy epitaxy and exposure of a further portion of the raised structures, in accordance with one or more aspects of the present invention.
Figure 11:
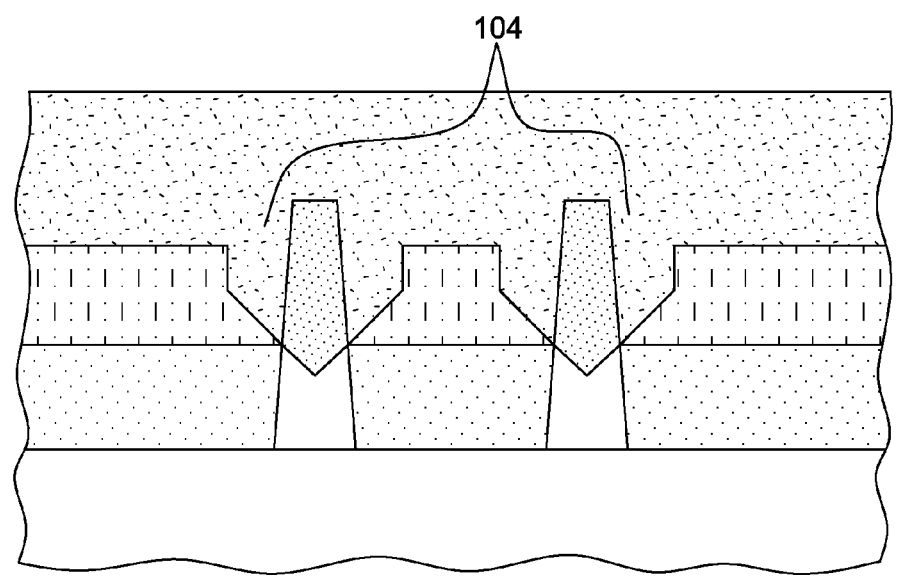

FIGS. 10 and 11 are cross-sectional views of the structures of FIGS. 8 and 9, respectively, after removal of the dummy epitaxy 118, in accordance with one or more aspects of the present invention. In one example, where the dummy epitaxy and the raised structures are silicon, removal of the dummy epitaxy may be accomplished by an etch selective to silicon, e.g., a controlled silicon dry etch, silicon wet etch, or a combination of dry etch and wet etch of silicon. Since the etch is selective to silicon, it will also remove portions 122 of the raised structures 104. In one example, the semiconductor structure is a non-planar transistor, such that removal of portions 122 serves to open areas 124 for subsequent source and drain epitaxy. As best shown in FIG. 10, extensions formed by etched layer 120 will serve to contain the subsequently grown replacement epitaxy, resulting in more uniform growth. Note that, in practice, a cleaning (e.g., using hydrofluoric acid) would typically be performed prior to replacement epitaxial growth.

Figure 12:
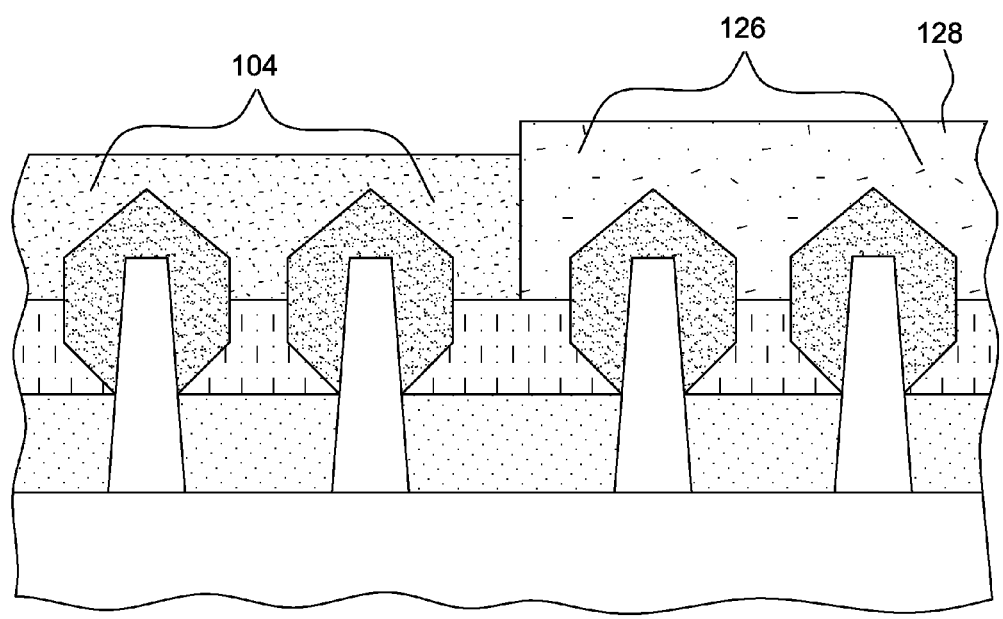
FIG. 12 is an alternate cross-sectional view of one example of the structure of FIG. 9 including a second set of opposite-type raised structures after creation of a hard mask thereover, in accordance with one or more aspects of the present invention.

FIG. 12 is an alternate cross-sectional view of one example of the structure of FIG. 9, and includes a second set 126 of opposite-type raised structures with a hard mask 128 thereover, in accordance with one or more aspects of the present invention. For example, raised structures 104 may be associated with p-type semiconductor devices (e.g., p-type non-planar transistor), while raised structures 126 may be associated with n-type semiconductor devices (e.g., n-type non-planar transistor). Hard mask 128 protects the n-type device during the selective etch of the p-type device. In one example, the hard mask includes silicon nitride, and may be deposited, for example, using CVD (Chemical Vapor Deposition), PECVD (Plasma-Enhanced CVD), or ALD (Atomic Layer Deposition).

Although omitted from the figures for simplicity, it will be understood that, after the p-type device selective etch and subsequent growing of the p-type replacement epitaxy, the hard mask over the n-type device would be removed, and a hard mask created over the p-type device to protect the same during removal of the dummy epitaxy of the n-type device and subsequent growing of the n-type replacement epitaxy. In other words, the basic process described with respect to FIGS. 1-11 and 13-14 is repeated for each of the n-type and p-type devices while protecting the other device type with a hard mask.

Optionally, one of the masks can be eliminated by using one of the replacement epitaxies as the dummy epitaxy. In one example, where the n-type and p-type devices are silicon-based, and epitaxial silicon germanium is the intended replacement or final epitaxy for the p-type devices, silicon germanium may be used as the dummy epitaxy. In that case, only one mask for the p-type device would be necessary while growing replacement epitaxy for the n-type devices.

Figure 13:
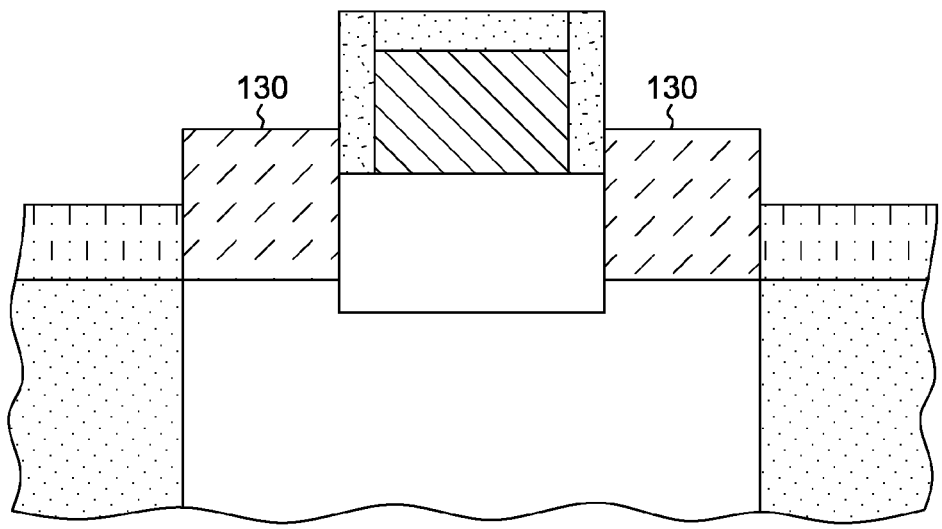
FIGS. 13 and 14 are cross-sectional views of the structures of FIGS. 10 and 11, respectively, after growing replacement epitaxy on the raised structures, in accordance with one or more aspects of the present invention.
Figure 14:
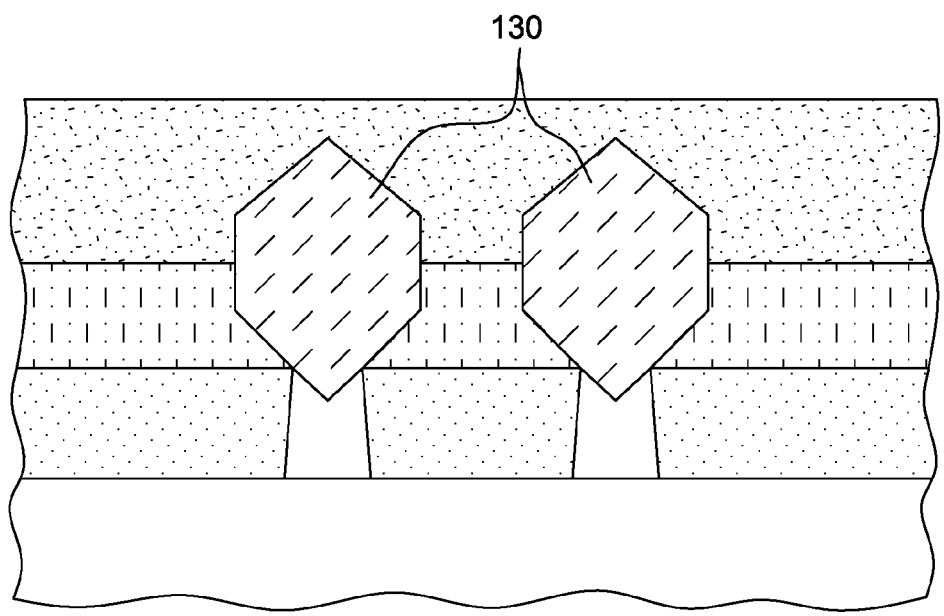

FIGS. 13 and 14 are cross-sectional views of the structures of FIGS. 10 and 11, respectively, after growing replacement epitaxy 130 on the raised structures in areas 124, in accordance with one or more aspects of the present invention. In one example, where both n-type and p-type silicon-based devices are present (as noted with respect to FIG. 12), the replacement epitaxy may be, for example, epitaxial silicon germanium (eSiGe) for the p-type devices and epitaxial silicon phosphorus (eSiP) for the n-type devices. In one example, the eSiGe may be grown using techniques such as vapor-phase epitaxy, molecular-beam epitaxy or liquid-phase epitaxy. Also, the SiGe may be in-situ doped with Boron. In another example, the eSiP may be grown using techniques such as vapor-phase epitaxy, molecular-beam epitaxy or liquid-phase epitaxy. The epitaxy may also be in-situ doped with phosphorus.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a starting non-planar semiconductor structure, the structure comprising a semiconductor substrate, at least one raised semiconductor structure coupled to the substrate, at least one gate surrounding a portion of the at least one raised structure, a gate cap and spacers around each gate, and a layer of isolation material on the substrate on opposite sides of the at least one raised structure;
   growing dummy epitaxy on one or more active regions of the at least one raised structure;
   creating an epitaxy containment layer of a desired height over the isolation layer, wherein the epitaxy containment layer separates adjacent dummy epitaxy; and
   replacing the dummy epitaxy with replacement epitaxy for one or more of the at least one raised structure, wherein the replacement epitaxy is contained by the epitaxy containment layer, and wherein the replacing comprises removing the dummy epitaxy to expose the at least one raised structure, and growing the replacement epitaxy on the exposed at least one raised structure.

2. The method of claim 1, wherein creating the epitaxy containment layer comprises:
   blanketly depositing layer of at least one dielectric material over the structure; and
   etching the dielectric layer to the desired height.

3. The method of claim 2, wherein the etching comprises:
   etching the dielectric layer and stopping on the gate cap of the at least one gate; and
   selectively etching the dielectric further to the desired height.

4. The method of claim 1, wherein the dummy epitaxy comprises a same material as the at least one raised structure, such that the removing also removes one or more portions of the at least one raised structure.

5. The method of claim 4, wherein the at least one raised semiconductor structure, the at least one gate and the one or more active regions together comprise at least one n-type non-planar semiconductor device and at least one p-type non-planar semiconductor device, and wherein the replacing comprises:
   creating a first hard mask over one of the at least one n-type non-planar device and the at least one p-type non-planar device;
   replacing the dummy epitaxy of the other of the at least one n-type non-planar device and the at least one p-type non-planar device; and
   removing the first hard mask.

6. The method of claim 5, further comprising:
   creating a second hard mask over the other of the at least one n-type non-planar device and the at least one p-type non-planar device;
   replacing the dummy epitaxy of the one of the at least one n-type non-planar device and the at least one p-type non-planar device; and
   removing the second hard mask.

7. The method of claim 6, wherein creating the epitaxy containment layer comprises:
   blanketly depositing layer of at least one dielectric material over the structure; and
   etching the dielectric layer to the desired height.

8. The method of claim 7, wherein the etching comprises:
   etching the dielectric layer and stopping on the gate cap of the at least one gate; and
   selectively etching the dielectric further to the desired height.

9. The method of claim 7, wherein:
   replacing the dummy epitaxy of the other of the at least one n-type non-planar device and the at least one p-type non-planar device comprises:

removing the dummy epitaxy to expose the at least one raised structure of the other of the at least one n-type non-planar device and the at least one p-type non-planar device; and growing the replacement epitaxy on the exposed at least one raised structure of the other of the at least one n-type non-planar device and the at least one p-type non-planar device; and replacing the dummy epitaxy of the one of the at least one n-type non-planar device and the at least one p-type non-planar device comprises:

removing the dummy epitaxy to expose the at least one raised structure of the at least one n-type non-planar device and the at least one p-type non-planar device; and growing the replacement epitaxy on the exposed at least one raised structure of the one of the at least one n-type non-planar device and the at least one p-type non-planar device.

10. The method of claim 9, wherein the etching comprises:

etching the dielectric layer and stopping on the gate cap of the at least one gate; and selectively etching the dielectric further to the desired height.

* * * * *